United States Patent
Johnsen et al.

(10) Patent No.: US 9,995,835 B2
(45) Date of Patent: Jun. 12, 2018

(54) SYSTEM AND METHOD OF IMPLEMENTING FINITE DIFFERENCE TIME DOMAIN MODELS WITH MULTIPLE ACCELERATED PROCESSING COMPONENTS (APCS)

(71) Applicant: Chevron U.S.A. Inc., San Ramon, CA (US)

(72) Inventors: Thor Johnsen, Pleasanton, CA (US); Alexander Loddoch, Houston, TX (US); Wei Liu, San Ramon, CA (US)

(73) Assignee: Chevron U.S.A. Inc., San Ramon, CA (US)

( * ) Notice: Subject to any disclaimer, the term of this patent is extended or adjusted under 35 U.S.C. 154(b) by 1019 days.

(21) Appl. No.: 13/944,653

(22) Filed: Jul. 17, 2013

(65) Prior Publication Data
US 2015/0025869 A1  Jan. 22, 2015

(51) Int. Cl.
G06G 7/48 (2006.01)
G01V 1/28 (2006.01)
G06F 17/50 (2006.01)
G01V 99/00 (2009.01)

(52) U.S. Cl.
CPC ............... *G01V 1/282* (2013.01); *G01V 1/28* (2013.01); *G06F 17/5018* (2013.01); *G01V 99/005* (2013.01); *G01V 2210/673* (2013.01)

(58) Field of Classification Search
CPC ..................... G01V 1/282; G06F 17/5018
USPC ........................................................ 703/10
See application file for complete search history.

(56) References Cited

U.S. PATENT DOCUMENTS

| 5,198,979 | A | * | 3/1993 | Moorhead | G01V 1/362 367/38 |
| 5,349,527 | A | * | 9/1994 | Pieprzak | G01V 1/301 367/45 |
| 5,504,678 | A | * | 4/1996 | Juszczak | G01V 1/28 702/14 |
| 5,537,319 | A | * | 7/1996 | Schoen | G01V 1/28 702/14 |

(Continued)

OTHER PUBLICATIONS

Bhardwaj et al. (Parallel Computing in Seismic Data Processing, PETROTECH-99, pp. 279-285).*

(Continued)

*Primary Examiner* — Omar Fernandez Rivas
*Assistant Examiner* — Iftekhar Khan
(74) *Attorney, Agent, or Firm* — Andrew J. Lagatta; Melissa M. Hayworth; Marie L. Clapp

(57) ABSTRACT

Embodiments of a method for implementing a finite difference time domain modeling with multiple APCs are disclosed herein. The disclosed methods and systems overcome the memory capacity limitation of APCs by having each APC perform multiple timesteps on a small piece of the computational domain or data volume in a APC queued manner. The cost of transferring data between host and compute accelerator can then be amortized over multiple timesteps, greatly reducing the amount of PCI bandwidth required to sustain high propagation speeds. The APC queued nature of the algorithm achieves linear scaling of PCI throughput with increasing number of APCs, allowing the algorithm to scale up to many dozens of APCs in some embodiments.

25 Claims, 7 Drawing Sheets

(56) References Cited

U.S. PATENT DOCUMENTS

| | | | | |
|---|---|---|---|---|
| 5,550,787 | A * | 8/1996 | Rialan | G01V 1/22 340/870.15 |
| 5,586,026 | A * | 12/1996 | Highnam | G01V 1/301 702/17 |
| 5,657,223 | A * | 8/1997 | Juszczak | G01V 1/28 702/14 |
| 5,734,829 | A * | 3/1998 | Robinson | G01V 1/28 702/14 |
| 5,995,904 | A * | 11/1999 | Willen | G06F 17/10 702/14 |
| 6,446,007 | B1 * | 9/2002 | Finn | G01V 1/28 702/14 |
| 6,778,909 | B1 * | 8/2004 | Popovici | G01V 1/28 702/17 |
| 6,885,946 | B1 * | 4/2005 | Drummond | G06F 15/8007 702/16 |
| 7,058,513 | B2 * | 6/2006 | Gilmer | G01V 1/053 702/14 |
| 7,095,678 | B2 * | 8/2006 | Winbow | G01V 1/301 367/38 |
| 7,661,137 | B2 * | 2/2010 | Gerard | G06F 21/125 380/30 |
| 8,391,564 | B2 * | 3/2013 | Yarman | G01V 1/28 382/109 |
| 9,063,248 | B2 * | 6/2015 | Liu | G01V 1/303 |
| 2003/0176974 | A1 * | 9/2003 | Baliguet | G01V 1/247 702/14 |
| 2004/0225443 | A1 | 11/2004 | Kamps | |
| 2005/0027455 | A1 * | 2/2005 | Kamps | G01V 1/28 702/17 |
| 2012/0072117 | A1 * | 3/2012 | Loddoch | G01V 1/301 702/16 |
| 2012/0316792 | A1 * | 12/2012 | Liu | G01V 99/00 702/16 |
| 2012/0331191 | A1 * | 12/2012 | Pell | G01V 1/22 710/68 |

OTHER PUBLICATIONS

Goutsins et al. (A 2-D Stochastic Earth Model for Seismic Inversion, Onepetro, 1985, pp. 385-386-285).*
Gary L. Pavlis (Three-dimensional, wavefield imaging of broadband seismic array data, Elsevier, 2011, pp. 1054-1066).*
Repin et al. (Interactive Three-Dimensional Visualization of Seismic Array Data, Computers & Geosciences vol. 23, No. 10, pp. 1079-1092, 1997).*
International Search Report, dated Apr. 2, 2015, during the prosecution of International Application No. PCT/US2014/040592.
Written Opinion of the International Searching Authority, dated Apr. 2, 2015, during the prosecution of International Application No. PCT/US2014/040592.

* cited by examiner

SYSTEM AND METHOD OF IMPLEMENTING FINITE DIFFERENCE TIME DOMAIN MODELS WITH MULTIPLE ACCELERATED PROCESSING COMPONENTS (APCS)

CROSS-REFERENCE TO RELATED APPLICATIONS

Not applicable.

STATEMENT REGARDING FEDERALLY SPONSORED RESEARCH OR DEVELOPMENT

Not applicable

BACKGROUND

Field of the Invention

This invention relates generally to the field of computer science in relation to the exploration for hydrocarbons. More specifically, the invention relates to a method of implementing finite difference time domain modeling with multiple APCs.

Background of the Invention

Finite difference time domain (FDTD) modeling is an important tool for oil and gas exploration. Graphic Processing Units (GPU) implementations of FDTD kernels provide the highest cost efficiency and are becoming the de facto industry standard. At present, GPUs, with respect to floating point operations, are many times faster than CPU processors. Specifically, modern day GPUs are very efficient at manipulating computer graphics, and their highly parallel structure makes them more effective than general-purpose CPUs for algorithms where processing of large blocks of data in parallel is required. Although GPUs and other compute accelerators have very high computational throughput, they lack the memory capacity required to handle the large volume of data in most oil and gas problems. A common work around is domain decomposition, a method that splits the computational domain or data volume into smaller pieces and assigns each piece to a separate compute accelerator. The limiting factor for the size of problem that can be handled then becomes the aggregate memory of all the compute accelerators attached to the system instead of the memory available to any single compute accelerator. In contrast, the CPU system memory is significantly larger and can readily be increased to accommodate even the largest models and most complex kernels in development today, but transferring data between system memory and compute accelerator memory is slow.

Consequently, there is a need for methods and systems to optimize usage of GPUs in FDTD methods.

BRIEF SUMMARY

Embodiments of a method for implementing a finite difference time domain modeling with multiple accelerated processing components ("APCs") are disclosed herein. The disclosed methods and systems overcome the memory capacity limitation of compute accelerators by having each compute accelerator perform multiple timesteps on a small piece of the computational domain or data volume in a APC queued manner. The cost of transferring data between host and compute accelerator can then be amortized over multiple timesteps, greatly reducing the amount of PCI bandwidth required to sustain high propagation speeds. The APC queued nature of the algorithm achieves linear scaling of PCI throughput with increasing number of compute accelerators, allowing the algorithm to scale up to more than 64 compute accelerators in some embodiments. Further details and advantages of various embodiments of the method are described in more detail below.

In an embodiment, a method of seismic modeling with a plurality of APCs comprises (a) storing at least a portion of data volume and a seismic model on to a system memory resource of a computer system. The data volume comprises two or more dimensions. The computer system comprises a APC queue coupled to the system memory resource. The APC queue comprises a plurality of APCs coupled to each other and to the system memory resource. The method also comprises (b) dividing the data volume along at least one of the dimensions to form a plurality of data blocks. In addition, the method comprises (c) transferring one or more of the data blocks from the system memory resource to a first APC in the queue. The first APC calculating at least one time iteration for at least one of the data blocks. Furthermore, the method comprises (d) transferring a data block from one APC within the queue to a next APC in the queue. The method additionally comprises (e) repeating (d) for each remaining APC in the queue. Each APC in the queue calculates at least one time iteration for at least one data block stored within each APC. The method further comprises (f) transferring one of the data blocks from a last APC in the queue to the system memory resource.

In another embodiment, a computer system comprises an interface for receiving a data volume. The data volume comprises two or more dimensions. The computer system also comprises a system memory resource and input and output functions for presenting and receiving communication signals to and from a human user. The computer system also comprises a queue of APCs coupled to the system memory resource via a communications bus. The queue comprising a plurality of APCs The computer system further comprises one or more central processing units for executing program instructions. The system memory resource is coupled to the central processing unit, used for storing a computer program including program instructions that, when executed by the one or more central processing units and the plurality of APCs, cause the computer system to perform a plurality of operations for seismic modeling. The plurality of operations comprise (a) storing at least a portion of a data volume and a seismic model on to the system memory resource. The data volume may comprise two or more dimensions. The plurality of operations also comprise: (b) dividing the data volume along at least one of the dimensions to form a plurality of data blocks. Additionally, the plurality of operations comprise: (c) transferring one or more of the data blocks from the system memory resource to a first APC in the queue, the first APC calculating at least one time iteration for one of the data blocks. The plurality of operations further comprise: (d) transferring a data block from one APC within the queue to a next APC in the queue. The plurality of operations also comprise: (e) repeating (d) for each remaining APC in the queue. Each APC in the queue calculates at least one time iteration for at least one data block stored within each APC. Moreover, the plurality of operations comprise: (f) transferring one of the data blocks from a last APC in the queue to the system memory resource.

In an embodiment, a method of seismic modeling comprises (a) inputting at least a portion of a data volume and a seismic model on the system memory resource of a computer system. The data volume comprises more than one dimension, and the computer system comprises a plurality of APCs coupled to each other and to the system memory resource. The method further comprises (b) dividing the data volume along at least one of the dimensions to form a plurality of data blocks. Moreover, the method comprises (c) transferring a subset of the data blocks from the system memory resource to one of the APCs. The method also comprises (d) transferring at least one data block from one APC to another APC. In addition, the method comprises (e) using each APC to calculate at least one time iteration for at least one data block stored within each APC and (f) transferring one of the data blocks from the plurality of APCs to the system memory resource.

The foregoing has outlined rather broadly the features and technical advantages of the invention in order that the detailed description of the invention that follows may be better understood. Additional features and advantages of the invention will be described hereinafter that form the subject of the claims of the invention. It should be appreciated by those skilled in the art that the conception and the specific embodiments disclosed may be readily utilized as a basis for modifying or designing other structures for carrying out the same purposes of the invention. It should also be realized by those skilled in the art that such equivalent constructions do not depart from the spirit and scope of the invention as set forth in the appended claims.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. This document does not intend to distinguish between components that differ in name but not function.

In the following discussion and in the claims, the terms "including" and "comprising" are used in an open-ended fashion, and thus should be interpreted to mean "including, but not limited to . . . ". Also, the term "couple" or "couples" is intended to mean either an indirect or direct connection. Thus, if a first device couples to a second device, that connection may be through a direct connection, or through an indirect connection via other devices and connections.

As used herein, "accelerated processing component" or "APC" refers to a device, chip, circuit or board including one more co-processors or accelerator chips which are designed to provide additional processing capability and designed to accelerate one or more types of computations outside of a central processing unit (CPU). Examples of APCs may include without limitation, GPUs as defined herein, co-processors, accelerator chips, or combinations thereof.

As used herein, "graphics processing unit" or "GPU" refers to a circuit or board including one more processors or accelerator chips which are designed to accelerate or rapidly manipulate large blocks of data typically for processing images or graphics. However, as known in the art, GPUs may be used interchangeably with any known accelerator chips for processing other types of data and should not be construed to be limited to processing graphics.

As used herein, "seismic trace" refers to the recorded data from a single seismic recorder or seismograph and typically plotted as a function of time or depth.

DETAILED DESCRIPTION OF THE PREFERRED EMBODIMENTS

Referring now to the Figures, embodiments of the disclosed methods will be described. As a threshold matter, embodiments of the methods may be implemented in numerous ways, as will be described in more detail below, including for example as a system (including a computer processing system), a method (including a computer implemented method), an apparatus, a computer readable medium, a computer program product, a graphical user interface, a web portal, or a data structure tangibly fixed in a computer readable memory. Several embodiments of the disclosed methods are discussed below. The appended drawings illustrate only typical embodiments of the disclosed methods and therefore are not to be considered limiting of its scope and breadth.

Figure 1:
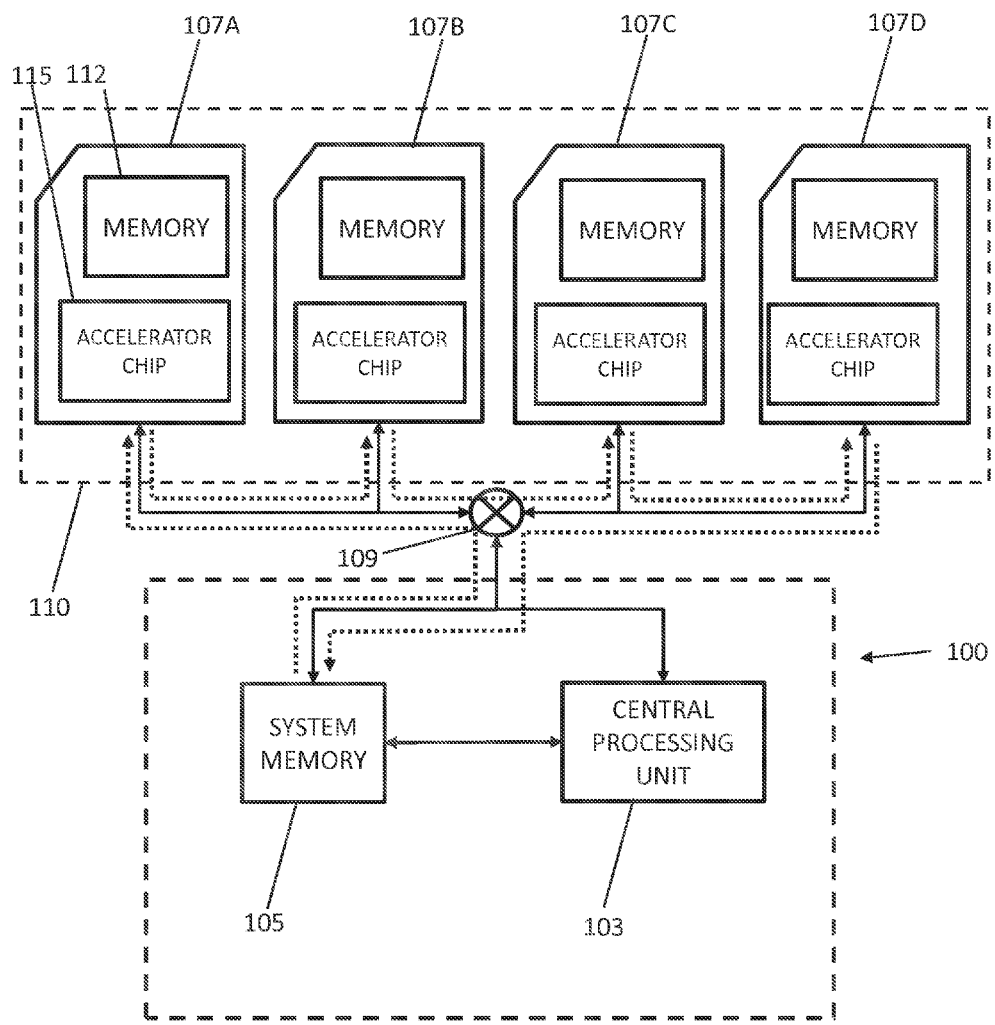
FIG. 1 illustrates a schematic representation of an embodiment of a system for use in an embodiment of the method of implementing a finite difference time domain modeling with multiple APCs.

FIG. 1 illustrates an embodiment of a system 100 which may be used with the disclosed methods. System 100 generally includes a motherboard 101 with a CPU 103 and system or system memory resource 105 coupled to each other. CPU 103 and system memory 105 are mounted or coupled to motherboard. Furthermore, system 100 includes a plurality of APCs 107A-107D. As discussed above, APCs 107A-107D may be and APC known to one of skill in the art including without limitation, GPUs, accelerator chips, co-processors, field-programmable gate arrays (FGPA), or combinations thereof. For clarification, although four APCs 107A-107D are depicted in FIG. 1, it is contemplated any number of APCs may be utilized in embodiments of disclosed methods and systems. In addition, it is contemplated that the disclosed methods and systems are not be limited to usage with APCs only. That is, in place of the APCs 107A-107D, any accelerator chip may be used instead.

APCs 107A-107D may be coupled to CPU and system memory 105 via a communication interface or bus 109. Bus 109 may be any known communications system which transfers data between various components in a computer system. APCs 107A-107D may be in communication with each other as well. In an embodiment, bus 109 may be a Peripheral Component Interconnect (PCI) bus. Other buses 109 which may be used include without limitation, Industry Standard Architecture (ISA), Video Electronics Standards Association (VESA), Accelerated Graphics Port (AGP), Universal Standard Bus (USB) or combinations thereof.

APCs 107A-107DD may each include a memory resource 112 and an accelerator chip 115. Memory resource 112 may be any suitable memory type such as without limitation, Graphics Double Data Rate Synchronous Dynamic Random Access Memory (GDDR SDRAM). Again, it is to be emphasized that APC queue 110 may have any suitable number of APCs. The set of APCs 107A-107D may be referred to as an APC queue 110. In addition, each APC 107 may have any suitable amount of memory 112. In an embodiment, each APC may have memory 112 ranging from about 1 GB to about 16 GB.

Figure 2:
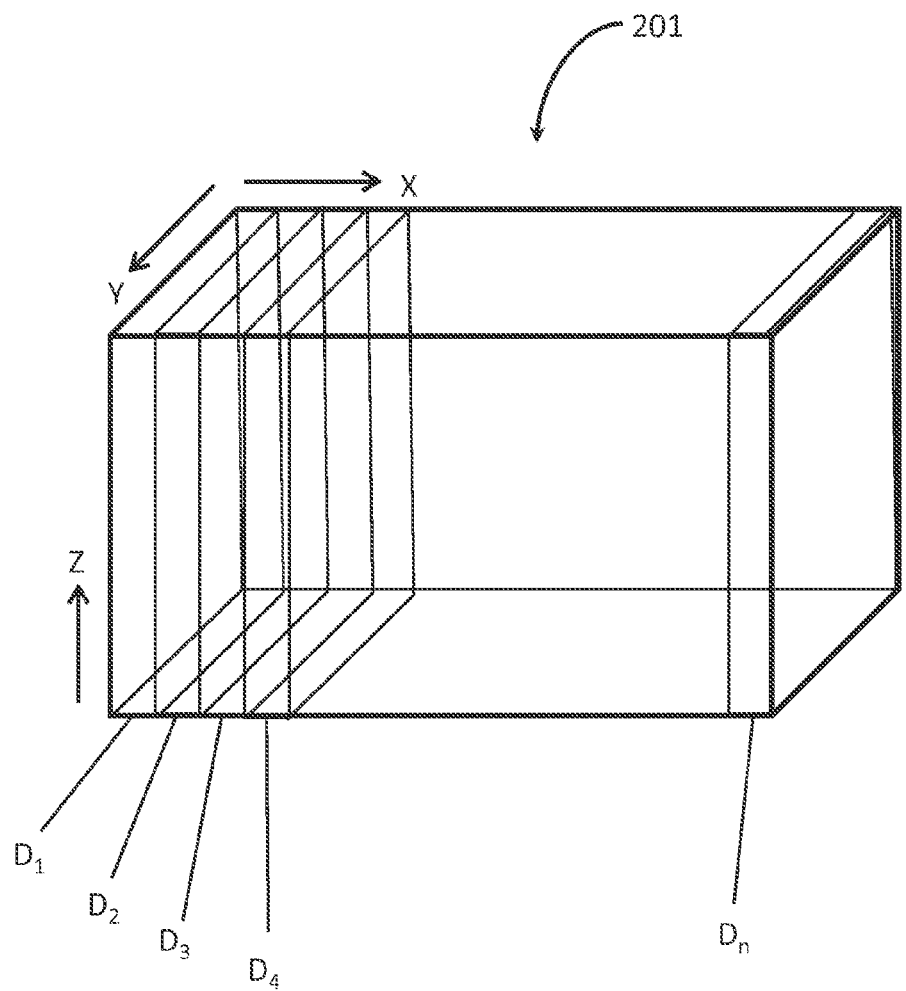
FIG. 2 illustrates a schematic representation of a data volume for use with an embodiment of the method of implementing a finite difference time domain modeling with multiple APCs.
Figure 3:
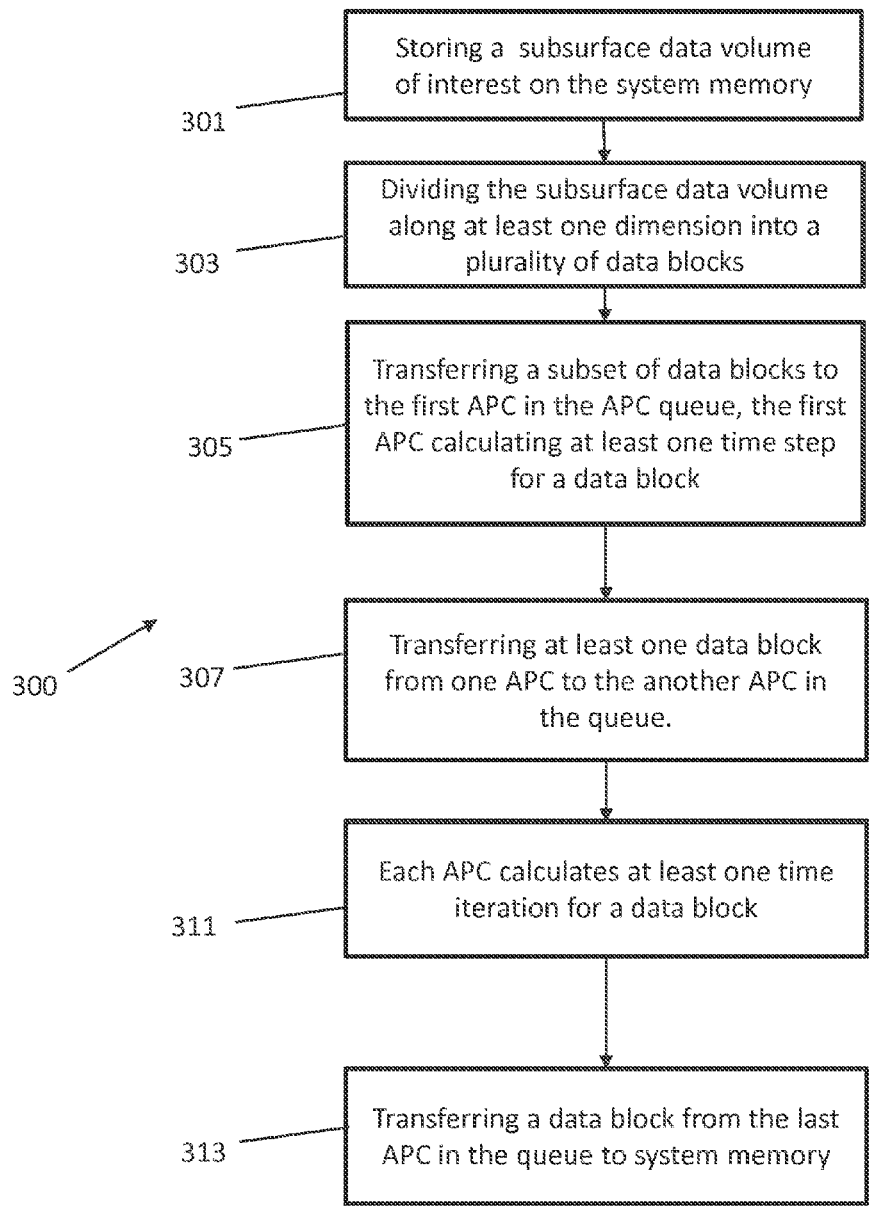
FIG. 3 illustrates a flowchart of an embodiment of the method of implementing a finite difference time domain modeling with multiple APCs.

In an embodiment, referring now to the flow chart in FIG. 3, all the data encompassing the volume to be modeled and also the seismic model may be kept in system memory 105 in block 301. System memory 105 may be any computer memory known to those of skill in the art such as without limitation, double data rate synchronous dynamic random-access memory (DDR SDRAM), static RAM (SRAM), dynamic RAM (DRAM), phase-change memory (PRAM), or combinations thereof. Referring now to FIG. 2, the data encompassing the subsurface volume to be modeled may be referred to as data volume 201. All or a portion of the data volume 201 may be stored in system memory 105. The portion of the data volume 201 that is held in system memory 105 can be compressed using either a lossless scheme, a high fidelity lossy scheme, or combinations thereof, or any methods known to those of skill in the art. In embodiments where the methods are applied in FDTD modeling of seismic wave propagation, the data with respect to the seismic model may include boundary conditions, propagation wavefields and earth model parameters. Referring now to FIG. 2, the data volume 201 may be split into blocks or sub-volumes by partitioning or dividing the data volume according to its dimensions. Specifically, data volume 201 may have X, Y and Z dimensions. In embodiments, again referring to FIG. 3, in 303, the data volume 201 may be partitioned or divided into smaller data blocks along at least one axis or dimension. Multiple division schemes are possible. However, in the simplest case, two of the dimensions are left intact and the last dimension is split into blocks or data volumes small enough to fit them in the compute accelerator memory. In one embodiment, the Y and Z axes are left intact and the X axes is divided, thus, forming data "slices" or "blocks," $D_1$ through $D_n$, where n is the total number of data blocks as can be seen in FIG. 2. However, in other embodiments, either the Y dimension may be divided or partitioned, and the X and Z dimension may remain intact. Likewise, the Z dimension may be partitioned and the X and Y dimension may remain intact.

The seismic model algorithm is iterated over the divided dimension, in this exemplary embodiment, X, and also the time range to be modeled. For example and without limitation, a seismic model may be propagated or iterated over a period of 10,000 ms in 1 ms increments. However, any time range with any suitable time increments may be utilized. The time range and number of iterations only limited by the current state of the art in APC processing speed. A subset of data blocks $D_1$ through $D_n$ may be sent from the host to the first compute accelerator or APC 107A in ascending X order in block 305 of FIG. 3. Specifically, three consecutive data blocks can generally be used to propagate one block by one time step or iteration—the data block that will be propagated plus its two adjacent or neighboring blocks holding the halo cells or data points of the loop dimension in block 305 of FIG. 3. However, any number of data blocks may be included in the subset. A subset of data blocks may contain just one data block in some embodiments.

Incoming data blocks $D_1$ through $D_n$ may be stored in accelerator or APC memory resource 112. More particularly, data blocks $D_1$ through $D_n$ may be stored in a sliding window buffer in memory 112. The blocks that have been propagated one timestep may be stored in a second sliding window buffer until enough blocks are available to propagate one block a second timestep. This can be repeated for more timesteps until the available memory on one APC has been exhausted. The output is sent to the next APC in line, which may propagate the same block through one or more timesteps in blocks 307 and 311. As discussed already, multiple compute accelerators or APCs are connected in a APC queue 110, the full APC queue potentially propagating each block one or more timesteps or time iterations. In embodiments where data volume 201 has been compressed, as described above, each data block may be decompressed by the first APC in the queue before the first timestep and then flows through the APC queue uncompressed. The block is compressed after the last timestep before it is transferred back to system memory 105. In another embodiment, data blocks may be compressed by an APC prior to sending processed data block to the next APC in the queue 110. This compression may be performed in real time. As disclosed above, the data blocks may be compressed by the APC using either a lossless scheme, a high fidelity lossy scheme, or combinations thereof, or any methods known to those of skill in the art.

The output from the final APC (e.g. APC 107D in FIG. 1) in the APC queue 110 is eventually copied back into system memory 105 in 313. For illustrative purposes, the dashed arrows illustrate the flow of the data blocks from system memory 105 through APC queue 110. When the data volume 201 has been exhausted, (i.e. all the blocks $D_1$-$D_n$ have been propagated the same number of timesteps (corresponding to the length of the APC queue 110)), the process is repeated until the wavefields have been propagated all the way to the last time point. As discussed briefly above, one of the primary advantages of utilizing a APC queue 110 may be avoiding the bottleneck of computer bus 109. As can be seen, any one of blocks $D_1$-$D_n$ only is transferred through bus 109 to the slower system memory 105 after passing through the APCAPC queue after any individual data block has gone through several timesteps. Furthermore, embodiments of the disclosed method are able to leverage the faster speed of the APC memory 112 and the APC 107 itself as opposed to the slower system memory 105 speed.

The APC queue 110 exhibits the same characteristics as other computing queues. For the initial computation, there is an initial lag while the APC queue 110 fills up before the first output data block from the last APC (e.g. 107D in FIG. 1) is produced, but once the APC queue 110 is full, in an embodiment, one output block may be produced for each input data block. When the data volume has been exhausted, there may still be several blocks in progress in the APC queue 110. These blocks need to be progressed which involves sending in additional data blocks to move the APC queue 110 forwards. Draining the APC queue 110 may be overlapped with filling it up for the next time iteration. When the seismic model algorithm reaches the end of the data volume 201, it simply goes back to the start of the volume and continues to send in blocks from there. The blocks at the beginning of the domain have already been propagated, so they will eventually form outputs that have been propagated 2*M timesteps (M being the length of the compute APC queue in timesteps), it takes M blocks to fill up the APC queue 110 for the second full iteration. During this second iteration, the remaining M blocks from the previous iteration are being produced. Consequently, the lag is only experienced once.

In an embodiment, data transfers and computations may be completely detached through double buffering and pinned memory. An extra set of buffers may be created for data transfers, results are written to one set of buffers and the buffers are switched for each step in the algorithm (every time a new subset of data blocks is sent into the APC queue). Double buffering allows data transfers and computations to be scheduled simultaneously, at the start of each step. Pinned memory enables asynchronous data transfers on the APCs. The compute accelerators have data transfer engines that can run in parallel with the compute engines, allowing data transfers and computations to overlap. Double buffering consumes a little bit of accelerator memory and adds extra lag time to the compute APC queue, but has no effect on compute throughput.

Each timestep or time iteration in the compute APC queue delays the output block by one position in X. This happens because the neighboring blocks on both sides of any particular block are used in order to propagate a block, so to propagate block N, blocks N−1, N and N+1. Consequently, if timestep i just propagated block N, we have enough input blocks for timestep J+1 to propagate block N−1. This has no impact on the throughput of the algorithm, but it is important to be aware of when blocks go in and out of system memory.

Load balancing between the compute accelerators may also improve overall throughput. Load balancing allows each compute accelerator to do the same amount of work. The workload may be distributed evenly when the total number of cells propagated in all timesteps is the same for all compute accelerators. In one embodiment, the load balancing may be achieved with a two step optimization process. First, APC queue width may be adjusted so that each APC queue propagates the same total number of cells (the sum of the blocked data volume sizes of all the timesteps). APC queues that are close to an edge may have fewer halo cells to propagate. Next, the total number of blocks propagated may be adjusted by one compute accelerator before the work is passed on to the next compute accelerator. The first timesteps in a APC queue may require more work than subsequent ones because of halo compute overheads, so if each compute accelerator does the same number of full timesteps, only the first compute accelerator in each APC queue will be busy all the time and each subsequent compute accelerator gets less and less work. This is easy to fix if we allow compute accelerators to partially finish their last timestep before they pass on a block to the next compute accelerator in the APC queue. The next compute accelerator finishes the partially completed timestep of its predecessor, does a few full timesteps of its own before partially finishing its own last timestep, which is then passed on to the next compute accelerator in the APC queue and so on. This scheme is easy to implement and allows us fine grained control of the amount of work done by each compute accelerator, so the compute load can be perfectly balanced.

As discussed above, in one embodiment, the simplest scheme splits one dimension and leaves the other two intact. Halo or ghost cells are eliminated in the loop dimension by the sliding window buffers described above, so the simplest blocking scheme has the advantage of completely eliminating halo overhead both in data transfers and computations. This embodiment may produce sufficiently small blocks for a data volume size of about one billion cells in, for example, a typical acoustic TTI propagator. However, the disclosed method is not limited by data volume size, and any data volume size may be used depending on the state of the art in system memory size and speed and APC memory size and speed.

Figure 4A:
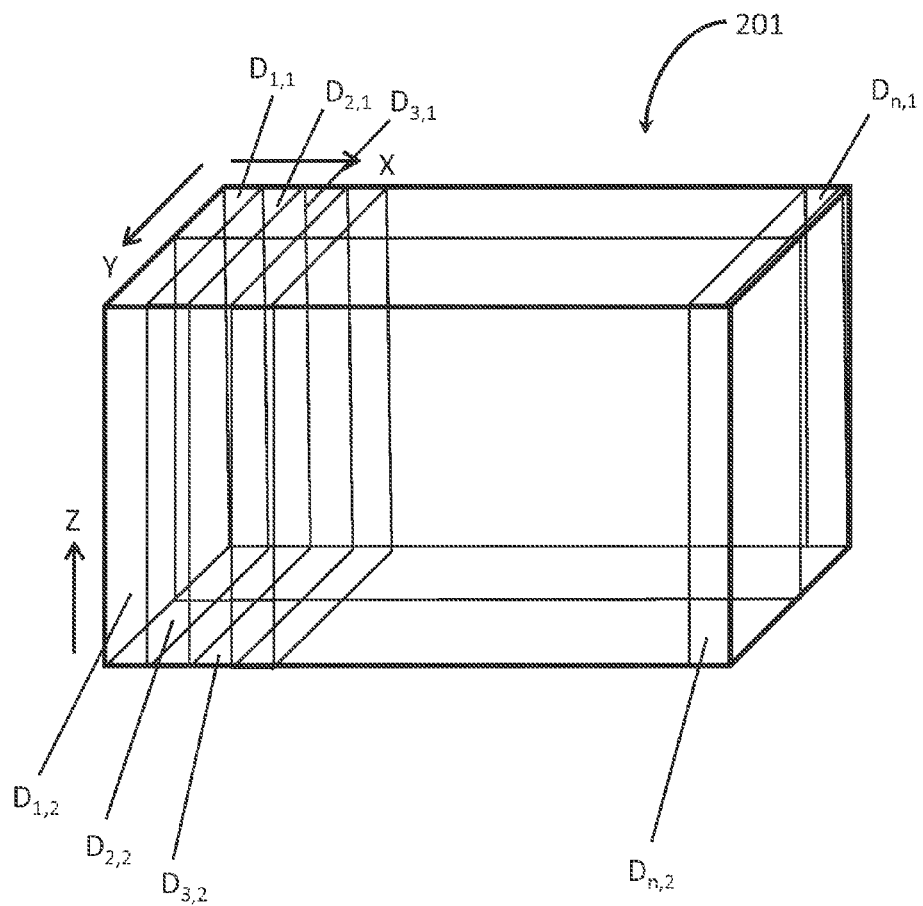
FIG. 4A illustrates a schematic representation of a data volume divided along two dimensions for use with an embodiment of the method of implementing a finite difference time domain modeling with multiple APCs.
Figure 5:
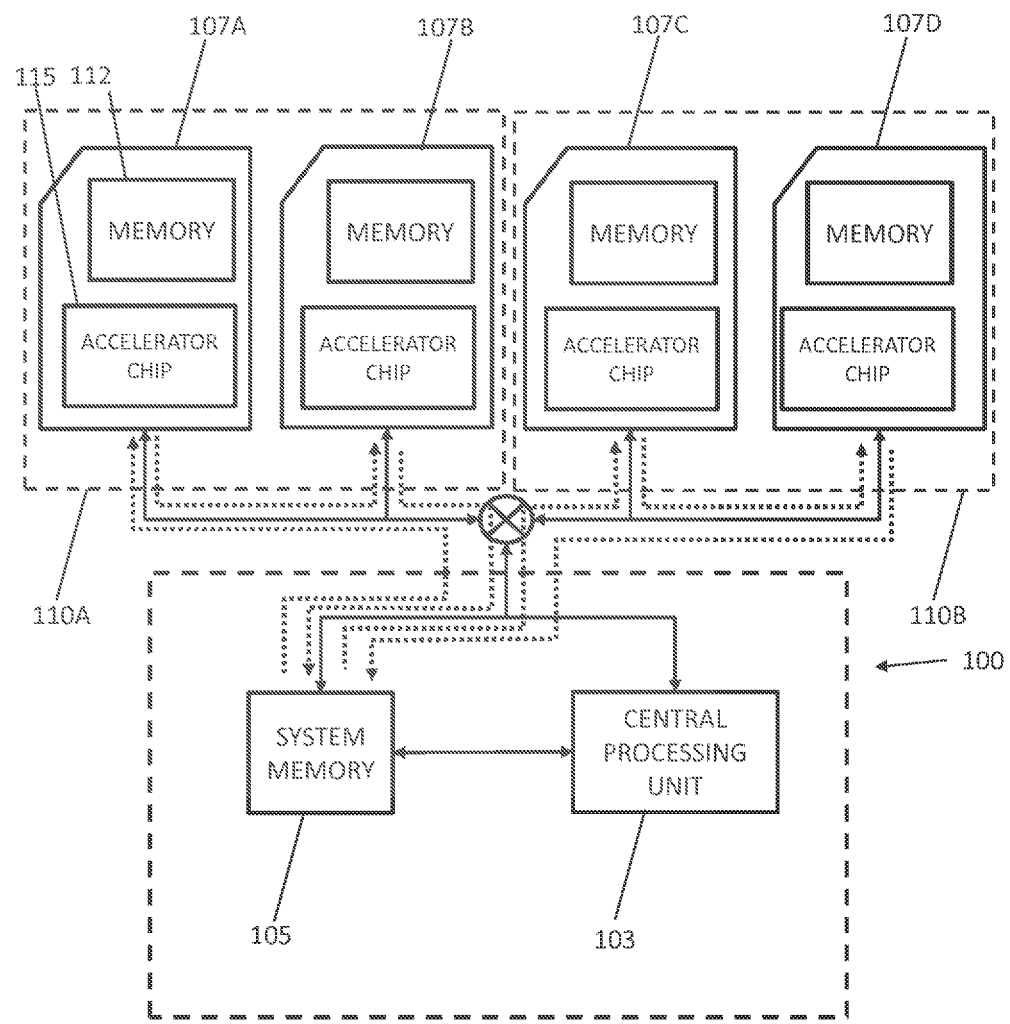
FIG. 5 illustrates another schematic representation of an embodiment of a system for use in an embodiment of the method of implementing a finite difference time domain modeling with multiple APCs.

Referring now to FIGS. 4A and 5, in another embodiment, larger data volumes may be handled by splitting one of the two remaining dimensions and creating a separate compute pipeline or APC queue for each. Any two dimensions may be selected for partitioning or division, but for the purposes of explanation, X is selected to be the first divided dimension and Y is the second divided dimension. Referring to FIG. 4A, data volume 201 has been divided in the X and Y dimension. $D_{X,Y}$ represents a particular iteration of a data block in volume 201. For example, $D_{3,1}$ represents the third data block along the X dimension, but in the first Y group. X has been divided n number of times as denoted by the n subscript for data block D whereas Y has been divided into 2. In such an embodiment, referring now to FIG. 5, separate compute APC queues 110A and 110B may be created for the each division of Y. Again, the dashed arrows represent the flow of the data blocks for each APC queue 110A-110B. As can be seen, each queue 110 may process its set of data blocks in parallel with the other queue. The size of the part of Y handled by one APC queue may be referred to as the (output) "width" of said APC queue. As such, Y may be divided any number of times to achieve the proper width for the APC queue. For example, Y may be divided by 4 and thus, four APC queues may be utilized. Doing this creates halo or ghost cells in Y. Synchronizing the APC queues in the loop dimension may prevent halo cells from being accidentally overwritten by competing APC queues. More particularly, the APC queues 110A-110B may receive input data blocks from the same loop dimension coordinate and may write blocks to the same loop dimension coordinate. Because of APC queue lag, this scheme ensures that halo cells are not overwritten by competing APC queues.

In an embodiment, an algorithm may be used for optimizing the data block size which starts with a wide block that gets narrower for each timestep until the last timestep where it becomes equal to the width of the APC queue. The halo cells created by the Y splitting are propagated twice (by two adjacent APC queues), so doing this creates computational overhead, but it eliminates the need to perform halo exchanges between each timestep in the APC queues. This allows the compute APC queues to continue to operate independently and all data transfers continue to take place strictly in an APC queued manner. The computational overhead introduced by splitting Y is generally low because the Y dimension is only split after it has grown very large and the relative halo overhead cost is proportional to the inverse of the APC queue width. The computational halo overhead cost can further be cut in half by careful load balancing between the APCs.

The data volume may be re-arranged in system memory 105 to make data transfers between host and APC as efficient as possible. Highest throughput is achieved when each block can be transferred in a single operation. In order to do this, the block may be contiguous in system memory, so system memory is reorganized to fit the data transfer patterns. In the simplest embodiment, only one dimension is divided and there is not a need to transfer overlapping blocks since halos may be handled by the sliding window buffers.

In embodiments where two dimensions of data volume are divided as shown in FIG. 4, as before there may not be any overlap in the first split dimension, but there may be overlap in the second split dimension. To accommodate these transfers, the fields in system memory 105 may be re-arranged into blocks along the first split dimension. Within each block in system memory 105, the first dimension then becomes the fast axis, the remaining intact dimension is the medium axis and the second split dimension is the slow axis. When system memory is organized like this, blocks that overlap in the second split dimension can be transferred in one contiguous piece between host and compute accelerator. Alternatively, the blocks can be re-arranged on the fly before they are transferred, but this may call for additional memory copies between different locations in system memory 105. This may be of concern because additional memory copies may put extra pressure on system memory bandwidth, which can ultimately slow down the data transfers between system memory 105 and APC 107. As such, careful organization of the data structures in system memory 105 before propagation starts may avoid an extra step.

Figure 4B:
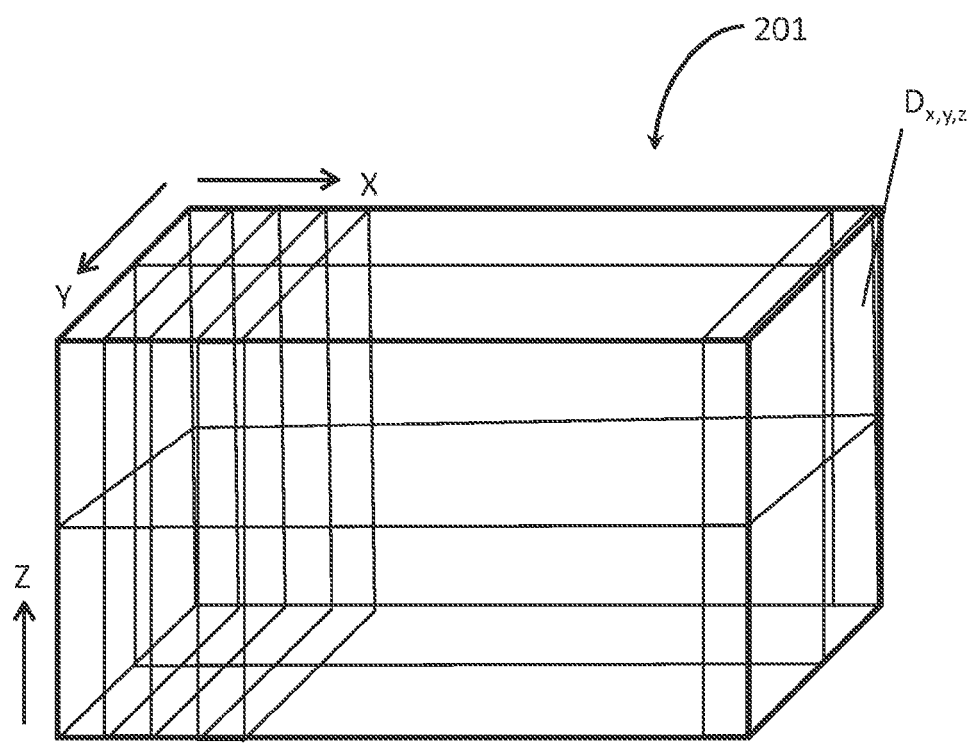
FIG. 4B illustrates a schematic representation of a data volume divided along three dimensions for use with an embodiment of the method of implementing a finite difference time domain modeling with multiple APCs

Various sizes of data volumes 201 may be handled by splitting at most two dimensions (e.g. X and Y) as shown in FIG. 4A, but it is contemplated that it is also possible to split data volumes 201 into three dimensions as shown in FIG. 4B. One dimension is the first split dimension (and thus also loop dimension), the remaining two are split into tiles and a APC queue is created for each tile. When the data volume is split in this way, as used herein, the term APC queue (output) "width" refers to the tile size each APC queue may handle. In the example shown in FIG. 4B, Y is split two ways and Z is split two ways resulting in the use of four APC queues. In an exemplary embodiment, if X is the first split dimension and loop dimension, Y is split 8-ways and Z is split 4-ways. As a result, a total of 32 compute APC queues that loop over X are created. If all these smaller data blocks or tiles are the same size, the "width" of one compute APC queue then becomes (NY/8)*(NZ/4) where NY and NZ are the Y and Z dimensions of the full data volume. This creates halo overhead for both Y and Z, which is handled in the same way as before—with redundant computations instead of halo exchanges. As before, careful load balancing between the compute accelerators may significantly decrease the computational halo overhead cost.

Generally, a APC queue 110 may be populated with its own set of dedicated compute accelerators or APC chips. This is usually the case on systems with high density of compute accelerators, but the disclosed methods may be applied to systems and situations where the APC queues outnumber the available APCs. This situation can arise in many cases, for instance when we are trying to propagate a large data volume on a system equipped with a single compute accelerator. Most workstations have a powerful Compute Unified Device Architecture (CUDA) capable graphics card, using the graphics card as a compute accelerator can double or triple the throughput of any FDTD propagator over what can be achieved with optimized CPU codes. If the data volume is large enough, we may have to create multiple compute APC queues to make the blocks small enough to fit into compute accelerator memory. Since we have more compute APC queues than compute accelerators, each compute accelerator has to emulate or act like multiple APC queues. The accelerator will exhaust the data volume fully before it switches to the next compute APC queue. The only complication this causes is that it makes it impossible to synchronize all the compute APC queues in the loop dimension. Because of this, separate input and output wavefields are needed to avoid overwriting halo cells.

This means more system memory is required, which reduces the maximum data volume size by about 10-30%, depending on the propagator type. The only limitation is the amount of system memory available in the current state of the art, which in this case usually is at least an order of a magnitude more than what is available on the compute accelerator.

Although the primary application is FDTD for seismic modeling, this method can be used to expand the maximum achievable data volume of any computational code running on compute accelerators that exhibit good spatial locality and has a concept of timestepping. Examples of other applications mat include without limitation, acoustic isotropic, acoustic vertically transverse isotropy (VTI), acoustic tilted transverse isotropy (TTI), elastic isotropic, elastic VTI, elastic TTI, elastic orthorhombic, elastic triclinic, visco-elastic, etc. Lattice-Boltzman methods for fluid flow simulation may also be another application of the disclosed methods. Furthermore, it is contemplated that the disclosed methods and systems may be applied to seismic imaging applications.

Figure 6:
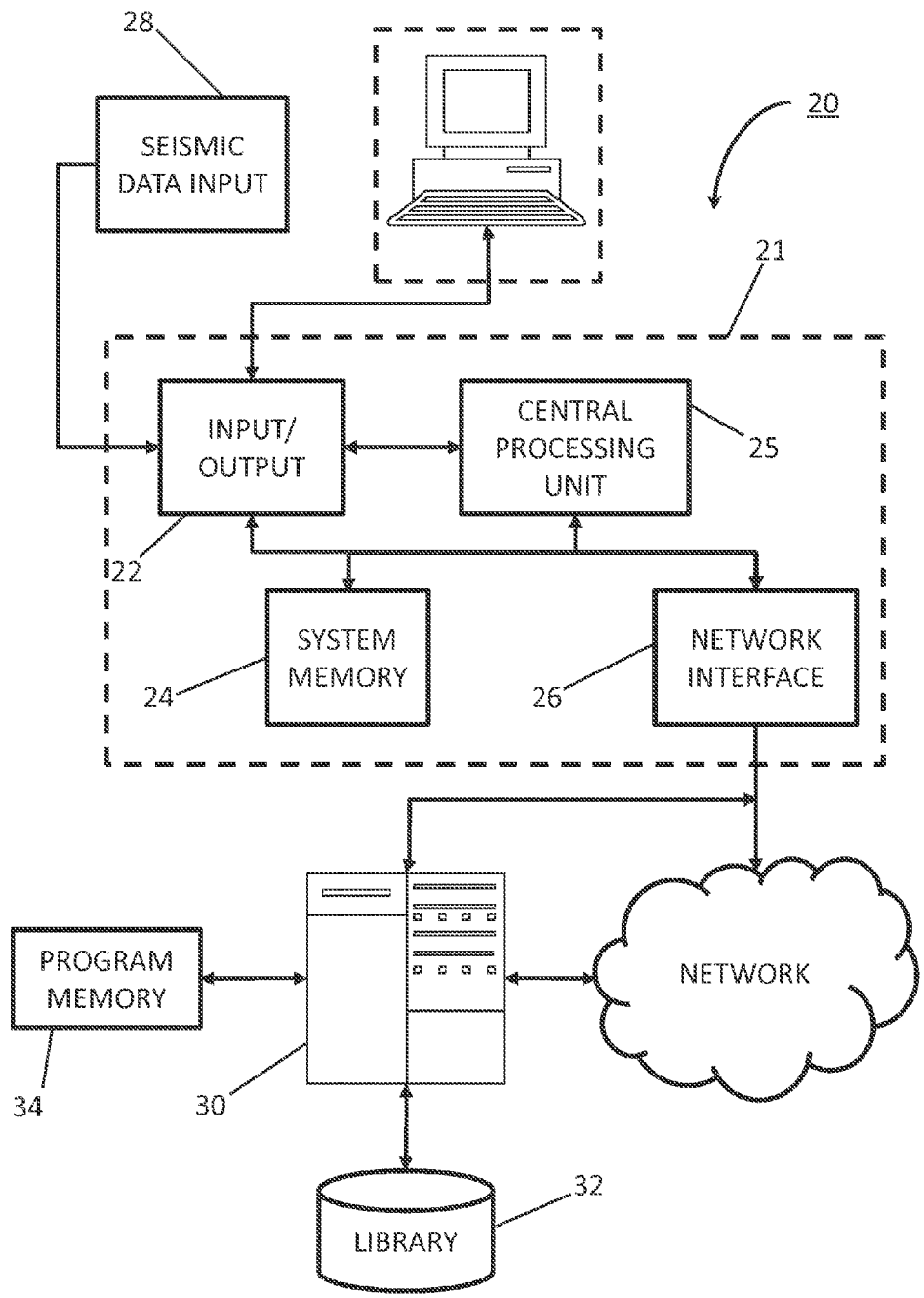
FIG. 6 illustrates an example of a computer system for use with embodiments of the disclosed methods.

FIG. 6 illustrates, in a broader sense, an example of an embodiment computer system 20, which may perform the operations described in this specification. In this example, system 20 is as realized by way of a computer system including workstation 21 connected to server 30 by way of a network. Of course, the particular architecture and construction of a computer system useful in connection with this invention can vary widely. For example, system 20 may be realized by a single physical computer, such as a conventional workstation or personal computer, or alternatively by a computer system implemented in a distributed manner over multiple physical computers. Accordingly, the generalized architecture illustrated in FIG. 5 is provided merely by way of example.

As shown in FIG. 6 and as mentioned above, system 20 may include workstation 21 and server 30. Workstation 21 includes central processing unit 25, coupled to system bus. Also coupled to system bus is input/output interface 22, which refers to those interface resources by way of which peripheral functions P (e.g., keyboard, mouse, display, etc.) interface with the other constituents of workstation 21. Central processing unit 25 refers to the data processing capability of workstation 21, and as such may be implemented by one or more CPU cores, co-processing circuitry, and the like. The particular construction and capability of central processing unit 25 is selected according to the application needs of workstation 21, such needs including, at a minimum, the carrying out of the functions described in this specification, and also including such other functions as may be executed by computer system. In the architecture of allocation system 20 according to this example, system memory 24 is coupled to system bus, and provides memory resources of the desired type useful as data memory for storing input data and the results of processing executed by central processing unit 25, as well as program memory for storing the computer instructions to be executed by central processing unit 25 in carrying out those functions. Of course, this memory arrangement is only an example, it being understood that system memory 24 may implement such data memory and program memory in separate physical memory resources, or distributed in whole or in part outside of workstation 21. In addition, as shown in FIG. 5, seismic data volume inputs 28 are input via input/output function 22, and stored in a memory resource accessible to workstation 21, either locally or via network interface 26.

Network interface 26 of workstation 21 is a conventional interface or adapter by way of which workstation 21 accesses network resources on a network. As shown in FIG. 5, the network resources to which workstation 21 has access via network interface 26 includes server 30, which resides on a local area network, or a wide-area network such as an intranet, a virtual private network, or over the Internet, and which is accessible to workstation 21 by way of one of those network arrangements and by corresponding wired or wireless (or both) communication facilities. In this embodiment of the invention, server 30 is a computer system, of a conventional architecture similar, in a general sense, to that of workstation 21, and as such includes one or more central processing units, system buses, and memory resources, network interface functions, and the like. According to this embodiment of the invention, server 30 is coupled to program memory 34, which is a computer-readable medium that stores executable computer program instructions, according to which the operations described in this specification are carried out by allocation system 30. In this embodiment of the invention, these computer program instructions are executed by server 30, for example in the form of a "web-based" application, upon input data communicated from workstation 21, to create output data and results that are communicated to workstation 21 for display or output by peripherals P in a form useful to the human user of workstation 21. In addition, library 32 is also available to server 30 (and perhaps workstation 21 over the local area or wide area network), and stores such archival or reference information as may be useful in allocation system 20. Library 32 may reside on another local area network, or alternatively be accessible via the Internet or some other wide area network. It is contemplated that library 32 may also be accessible to other associated computers in the overall network.

The particular memory resource or location at which the measurements, library 32, and program memory 34 physically reside can be implemented in various locations accessible to allocation system 20. For example, these data and program instructions may be stored in local memory resources within workstation 21, within server 30, or in network-accessible memory resources to these functions. In addition, each of these data and program memory resources can itself be distributed among multiple locations. It is contemplated that those skilled in the art will be readily able to implement the storage and retrieval of the applicable measurements, models, and other information useful in connection with this embodiment of the invention, in a suitable manner for each particular application.

According to this embodiment, by way of example, system memory 24 and program memory 34 store computer instructions executable by central processing unit 25 and server 30, respectively, to carry out the disclosed operations described in this specification, for example, by way of which the elongate area may be aligned and also the stacking of the traces within the elongate area. These computer instructions may be in the form of one or more executable programs, or in the form of source code or higher-level code from which one or more executable programs are derived, assembled, interpreted or compiled. Any one of a number of computer languages or protocols may be used, depending on the manner in which the desired operations are to be carried out. For example, these computer instructions may be written in a conventional high level language, either as a conventional linear computer program or arranged for execution in an object-oriented manner. These instructions may also be embedded within a higher-level application. Such computer-executable instructions may include programs, routines, objects, components, data structures, and computer software technologies that can be used to perform particular tasks and process abstract data types. It will be appreciated that the scope and underlying principles of the disclosed methods are not limited to any particular computer software technology. For example, an executable web-based application can reside at program memory 34, accessible to server 30 and client computer systems such as workstation 21, receive inputs from the client system in the form of a spreadsheet, execute algorithms modules at a web server, and provide output to the client system in some convenient display or printed form. It is contemplated that those skilled in the art having reference to this description will be readily able to realize, without undue experimentation, this embodiment of the invention in a suitable manner for the desired installations. Alternatively, these computer-executable software instructions may be resident elsewhere on the local area network or wide area network, or downloadable from higher-level servers or locations, by way of encoded information on an electromagnetic carrier signal via some network interface or input/output device. The computer-executable software instructions may have originally been stored on a removable or other non-volatile computer-readable storage medium (e.g., a DVD disk, flash memory, or the like), or downloadable as encoded information on an electromagnetic carrier signal, in the form of a software package from which the computer-executable software instructions were installed by allocation system 20 in the conventional manner for software installation.

While the embodiments of the invention have been shown and described, modifications thereof can be made by one skilled in the art without departing from the spirit and teachings of the invention. The embodiments described and the examples provided herein are exemplary only, and are not intended to be limiting. Many variations and modifications of the invention disclosed herein are possible and are within the scope of the invention. Accordingly, the scope of protection is not limited by the description set out above, but is only limited by the claims which follow, that scope including all equivalents of the subject matter of the claims.

The discussion of a reference is not an admission that it is prior art to the present invention, especially any reference that may have a publication date after the priority date of this application. The disclosures of all patents, patent applications, and publications cited herein are hereby incorporated herein by reference in their entirety, to the extent that they provide exemplary, procedural, or other details supplementary to those set forth herein.

What is claimed is:

1. A method of seismic modeling with a plurality of accelerated processing components (APCs), the method comprising:
   (a) storing at least a portion of data volume and a seismic model on to a system memory resource of a computer system, wherein the data volume comprises two or more dimensions, the computer system comprising an APC queue coupled to the system memory resource, the APC queue comprising a plurality of APCs coupled to each other and to the system memory resource, the APCs comprising programmable circuits separate from a central processing unit (CPU) and configured to accelerate one or more computations external to the CPU;
   (b) dividing the data volume along two or more dimensions to form a plurality of data blocks, dividing the plurality of data blocks further into two or more datasets representative of the two or more dimensions, each dataset having a designated APC queue, and further dividing the APC queue into a plurality of APC queues such that each APC queue is associated with one of the dimensions of the data volume;

(c) for each dataset, transferring a subset of the dataset from the system memory resource to a first APC, in the designated APC queue for the dataset, the first APC calculating at least a first time iteration for at least one of the data blocks to form one or more output data blocks;

(d) transferring an output data block representing a time iteration from one APC within the queue to a next APC in the queue as an input data block without storage of the output data block in system memory for processing a next time iteration;

(e) repeating (d) for each queue of APCs, wherein each APC in the queue calculates at least one time iteration for at least one data block stored within each APC different from the time iterations of the other APCs in the queue; and (f) transferring one of the data blocks from a last APC in each designated APC queue to the system memory resource.

2. The method of claim 1, further comprising repeating (c) through (f) until all time iterations of the seismic model have been completed and outputting a resulting seismic model.

3. The method of claim 1 wherein (c) through (f) occurs substantially simultaneously.

4. The method of claim 1 wherein the queue of APCs comprises at least eight APCs.

5. The method of claim 1 wherein each group of APCs comprises an equal number of APCs.

6. The method of claim 1 wherein (b) comprises dividing the data volume along three dimensions.

7. The method of claim 1 wherein the data volume comprises three dimensions.

8. The method of claim 1 wherein the subset of the data volume comprises at least three data blocks.

9. The method of claim 1, wherein (a) comprises compressing at least a portion of the data volume in the system memory resource.

10. The method of claim 9, wherein the portion of the data volume is compressed by a lossless scheme, a high fidelity lossy scheme, or combinations thereof.

11. The method of claim 1, further comprising using an algorithm to balance a computational load for each APC within the APC queue during (c) through (f).

12. The method of claim 1 wherein the plurality of APCs comprises one or more GPUs.

13. The method of claim 1 wherein (d) further comprises compressing the data block prior to transferring the data block to the next APC.

14. A computer system, comprising:
an interface for receiving a data volume, the data volume comprising two or more dimensions;
a system memory resource;
input and output functions for presenting and receiving communication signals to and from a human user;
a queue of accelerated processing components (APCs) coupled to the system memory resource via a communications bus, the queue comprising a plurality of APCs, the APCs comprising programmable circuits separate from a central processing unit (CPU) and configured to accelerate one or more computations external to the CPU;
one or more central processing units for executing program instructions; the system memory resource coupled to the central processing unit for storing a computer program including program instructions that, when executed by the one or more central processing units and the plurality of APCs, cause the computer system to perform a plurality of operations for seismic modeling, the plurality of operations comprising:

(a) storing at least a portion of a data volume and a seismic model on to the system memory resource, wherein the data volume comprises two or more dimensions;

(b) dividing the data volume along two or more dimensions to form a plurality of data blocks, dividing the plurality of data blocks further into two or more datasets representative of the two or more dimensions, each dataset having a designated APC queue, and further dividing the APC queue into a plurality of APC queues such that each APC queue is associated with one of the dimensions of the data volume;

(c) for each dataset, transferring a subset of the data blocks from the system memory resource to a first APC in the designated APC queue for the dataset, the first APC calculating a first time iteration for one of the data blocks, forming one or more output data blocks;

(d) transferring an output data block representing a time iteration from one APC within the queue to a next APC in the queue as an input data block without storage of the output data block in system memory for processing a next time iteration;

(e) repeating (d) for each queue of APCs, wherein each APC in the queue calculates at least one time iteration for at least one data block stored within each APC different from the time iterations of the other APCs in the queue; and (f) transferring one of the data blocks from a last APC in each designated APC queue to the system memory resource.

15. The system of claim 14, further comprising repeating (c) through (f) until all time iterations of the seismic model have been completed.

16. The system of claim 14 wherein (c) through (f) occurs substantially simultaneously.

17. The system of claim 14 wherein the queue of APCs comprises at least eight APCs.

18. The system of claim 14 wherein each group of APCs comprises an equal number of APCs.

19. The system of claim 14, wherein (a) comprises compressing at least a portion of the data volume in the system memory resource.

20. The system of claim 19, wherein the portion of the data volume is compressed by a lossless scheme, a high fidelity lossy scheme, or combinations thereof.

21. The system of claim 14, further comprising using an algorithm to balance a computational load for each APC within the APC queue during (c) through (f).

22. The system of claim 14 wherein the plurality of APCs comprises one or more GPUs.

23. The system of claim 14 wherein (d) further comprises compressing the data block prior to transferring the data block to the next APC.

24. A method of seismic modeling, the method comprising:

(a) inputting at least a portion of a data volume and a seismic model on the system memory resource of a computer system, wherein the data volume comprises two or more dimensions, and the computer system comprises a plurality of accelerated processing components (APCs) coupled to each other and to the system memory resource, the APCs being programmable circuits separate from a central processing unit (CPU) and configured to accelerate one or more computations external to the CPU;

(b) dividing the data volume along two or more dimensions to form a plurality of data blocks, dividing the plurality of data blocks further into two or more datasets representative of the two or more dimensions, each dataset having a designated APC queue, and further dividing the APC queue into a plurality of APC queues such that each APC queue is associated with one of the dimensions of the data volume;

(c) for each dataset, transferring a subset of the data blocks from the system memory resource to a first APC in the designated APC queue for the dataset, the first APC calculating a first time iteration for one of the data blocks, forming one or more output data blocks;

(d) transferring an output data block representing a time iteration from one APC within the queue to a next APC in the queue as an input data block without storage of the output data block in system memory for processing a next time iteration;

(e) repeating (d) for each queue of APCs, wherein each APC in the queue calculates at least one time iteration for at least one data block stored within each APC different from the time iterations of the other APCs in the queue; and (f) transferring one of the data blocks to the system memory resource.

25. The method of claim 24 wherein (c) through (f) occurs substantially simultaneously.

* * * * *